United States Patent
Shinohara

(10) Patent No.: US 10,522,502 B2
(45) Date of Patent: Dec. 31, 2019

(54) ANISOTROPIC CONDUCTIVE FILM AND CONNECTED STRUCTURE

(71) Applicant: DEXERIALS CORPORATION, Tokyo (JP)

(72) Inventor: Seiichiro Shinohara, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 380 days.

(21) Appl. No.: 15/030,509

(22) PCT Filed: Nov. 18, 2014

(86) PCT No.: PCT/JP2014/080430
§ 371 (c)(1),
(2) Date: Apr. 19, 2016

(87) PCT Pub. No.: WO2015/076234
PCT Pub. Date: May 28, 2015

(65) Prior Publication Data
US 2016/0270225 A1    Sep. 15, 2016

(30) Foreign Application Priority Data

Nov. 19, 2013 (JP) ................. 2013-239180
Sep. 22, 2014 (JP) ................. 2014-193168
Oct. 28, 2014 (JP) ................. 2014-219793

(51) Int. Cl.
*H05K 1/11* (2006.01)
*H05K 1/03* (2006.01)
(Continued)

(52) U.S. Cl.
CPC ............ *H01L 24/83* (2013.01); *C09J 7/20* (2018.01); *C09J 9/02* (2013.01); *H01L 24/27* (2013.01);
(Continued)

(58) Field of Classification Search
None
See application file for complete search history.

(56) References Cited

U.S. PATENT DOCUMENTS

| | | | |
|---|---|---|---|
| 2009/0166079 A1 | 7/2009 | Hatanaka | |
| 2010/0263208 A1 | 10/2010 | Arifuku et al. | |
| 2013/0135838 A1* | 5/2013 | Tsukao | H01B 1/20 361/807 |

FOREIGN PATENT DOCUMENTS

| | | |
|---|---|---|
| EP | 2 075 836 A1 | 7/2009 |
| JP | H06-223943 A | 8/1994 |

(Continued)

OTHER PUBLICATIONS

Feb. 6, 2018 Office Action issued in Japanese Patent Application No. 2017-063281.
(Continued)

Primary Examiner — Jeffrey D Washville
(74) Attorney, Agent, or Firm — Oliff PLC

(57) ABSTRACT

Anisotropic conductive films, each including an insulating adhesive layer and conductive particles insulating adhesive layer in a lattice-like manner. Among center distances between an arbitrary conductive particle and conductive particles adjacent to the conductive particle, the shortest distance to the conductive particle is a first center distance; the next shortest distance is a second center distance. These center distances are 1.5 to 5 times the conductive particles' diameter. The arbitrary conductive particle, conductive particle spaced apart from the conductive particle by the first center distance, conductive particle spaced apart from the conductive particle by first center distance or second center distance form an acute triangle. Regarding this acute triangle, an acute angle formed between a straight line orthogonal to a first array direction passing through the conductive particles and second array direction passing (Continued)

through conductive particles being 18 to 35°. These anisotropic conductive films have stable connection reliability in COG connection.

37 Claims, 5 Drawing Sheets

(51) Int. Cl.
    *H05K 1/18* (2006.01)
    *H01L 23/00* (2006.01)
    *C09J 9/02* (2006.01)
    *C09J 7/20* (2018.01)
    *H05K 3/32* (2006.01)
    *C08K 3/08* (2006.01)

(52) U.S. Cl.
    CPC .............. *H01L 24/29* (2013.01); *H01L 24/73* (2013.01); *H01L 24/81* (2013.01); *H01L 24/92* (2013.01); *C08K 3/08* (2013.01); *C08K 2201/001* (2013.01); *C09J 2201/602* (2013.01); *C09J 2203/326* (2013.01); *C09J 2205/102* (2013.01); *C09J 2463/00* (2013.01); *C09J 2467/006* (2013.01); *H01L 24/13* (2013.01); *H01L 24/16* (2013.01); *H01L 2224/13144* (2013.01); *H01L 2224/271* (2013.01); *H01L 2224/294* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/29387* (2013.01); *H01L 2224/29499* (2013.01); *H01L 2224/73204* (2013.01); *H01L 2224/81903* (2013.01); *H01L 2224/83101* (2013.01); *H01L 2224/83203* (2013.01); *H01L 2224/83851* (2013.01); *H01L 2224/9211* (2013.01); *H05K 3/323* (2013.01)

(56) References Cited

FOREIGN PATENT DOCUMENTS

| JP | H09-320345 A | 12/1997 |
|---|---|---|
| JP | 2001-307555 A | 11/2001 |
| JP | 2003-013021 A | 1/2003 |
| JP | 3624818 B2 | 3/2005 |
| JP | 2005-144745 A | 6/2005 |
| JP | 2006-233203 A | 9/2006 |
| JP | 2007-080522 A | 3/2007 |
| JP | 2009-135388 A | 6/2009 |
| JP | 2009-283431 A | 12/2009 |
| JP | 2010-261003 A | 11/2010 |
| JP | 2011-231136 A | 11/2011 |
| JP | 4887700 B2 | 2/2012 |
| JP | 2013-077557 A | 4/2013 |
| JP | 2016-66573 A | 4/2016 |
| JP | 2017-188446 A | 10/2017 |
| KR | 10-1193757 B1 | 10/2012 |
| TW | I263285 B | 10/2006 |
| WO | 97/45893 A1 | 12/1997 |
| WO | 2012/169498 A1 | 12/2012 |
| WO | 2013/024544 A1 | 2/2013 |

OTHER PUBLICATIONS

Jul. 10, 2018 Office Action issued in Korean Application No. 10-2018-7010853.
Jan. 24, 2018 Chinese Office Action issued in Chinese Patent Application No. 201480057445.1.
May 11, 2018 Office Action issued in Taiwanese Application No. 103140027.
Feb. 2, 2016 International Preliminary Report on Patentablity issued in International Patent Application No. PCT/JP2014/080430.
Oct. 20, 2015 Written Opinion issued in International Patent Application No. PCT/JP2014/080430.
Feb. 24, 2015 International Search Report issued in International Patent Application No. PCT/JP2014/080430.
Apr. 17, 2018 Office Action Issued in Japanese Patent Application No. 2017-063281.
Jan. 3, 2018 Office Action issued in Korean Patent Application No. 10-2016-7010177.
Jul. 30, 2018 Office Action issued in Japanese Application No. 2017-063281.
Nov. 24, 2017 Notification of Reasons for Refusal issued in Japanese Patent Application No. JP 2017-063298.
Dec. 13, 2016 Office Action issued in Japanese Patent Application No. 2014-219793.
Aug. 2, 2018 Office Action issued in Chinese Application No. 201710112148.8.
Sep. 30, 2018 Office Action issued in Chinese Application No. 201480057445.1.
Nov. 19, 2018 Office Action issued in Korean Patent Application No. 10-2016-7010177.
Nov. 22, 2018 Office Action issued in Korean Patent Application No. 10-2018-7010853.
Mar. 5, 2019 Office Action issued in Chinese Application No. 201710112148.8.
Apr. 4, 2019 Office Action issued in Korean Application No. 10-2016-7010177.
Jan. 22, 2019 Office Action issued in Chinese Application No. 201810229524.6.
Feb. 1, 2019 U.S. Office Action issued U.S. Appl. No. 16/003,310.
Feb. 28, 2019 Office Action in Korean Application No. 10-2018-7010853.
May 7, 2019 Office Action issued in Japanese Application No. 2018-134336.
May 21, 2019 Office Action issued in Korean Application No. 10-2019-7012986.
Jul. 2, 2019 Office Action issued in Japanese Patent Application No. 2017-063281.
Jul. 9, 2019 Office Action issued in Taiwanese Patent Application No. 107138270.
Aug. 27, 2019 Office Action issued in Chinese Patent Application No. 201810229524.6.
Sep. 30, 2019 Office Action issued in Chinese Patent Application No. 201710112148.8.

* cited by examiner

ANISOTROPIC CONDUCTIVE FILM AND CONNECTED STRUCTURE

TECHNICAL FIELD

The present invention relates to an anisotropic conductive film, a connecting method using the anisotropic conductive film, and a connected structure obtained by connection with the anisotropic conductive film.

BACKGROUND ART

Anisotropic conductive films are widely used when mounting electronic components such as IC chips on substrates. In recent years, more highly dense wiring is demanded in compact electronic apparatuses such as cellular phones and notebook computers. As a measure for adapting anisotropic conductive films to such highly dense wiring, there is known a technology in which conductive particles are uniformly disposed in a matrix-like manner in an insulating adhesive layer of an anisotropic conductive film.

However, there is a problem in which even when conductive particles are uniformly arranged, connection resistance varies. This is because conductive particles placed on the edge of a terminal flow into spaces due to melting of an insulating adhesive, and are therefore difficult to be caught between terminals located below and above the particles. To address this problem, there has been proposed that when a first array direction of conductive particles is a longitudinal direction of an anisotropic conductive film, a second array direction intersecting the first array direction is tilted at 5° or more and 15° or less with respect to a direction orthogonal to the longitudinal direction of the anisotropic conductive film (Patent Literature 1).

CITATION LIST

Patent Literature

Patent Literature 1: Japanese Patent No. 4887700

SUMMARY OF INVENTION

Technical Problem

However, as the bump size of an electronic component connected with the anisotropic conductive film becomes smaller, the number of conductive particles which can be trapped by the bump becomes smaller. Thus, the anisotropic conductive film described in Patent Literature 1 failed to provide sufficient conduction reliability in some cases. Especially, in a so-called COG connection that connects a control IC of a liquid crystal screen or the like to a transparent electrode on a glass substrate, the bump size becomes smaller due to the increased number of terminals associated with higher definition liquid crystalline screen and the miniaturized IC chips. Consequently, it has become a challenge to increase the number of conductive particles that can be trapped by a bump and enhance connection reliability.

To address this, an object of the present invention is to provide stable connection reliability even when the anisotropic conductive film is used in the COG connection.

Solution to Problem

The present inventor has found that when an anisotropic conductive film including conductive particles arranged on an insulating adhesive layer in a lattice-like manner has a specific relationship between an inter-particle distance and an array direction of the conductive particles, anisotropic conductive connection can be performed with stable connection reliability even in COG connection in which high density wiring is required. Thus, the present invention has been completed.

That is, the present invention provides an anisotropic conductive film including an insulating adhesive layer and conductive particles arranged in the insulating adhesive layer in a lattice-like manner, wherein when among center distances between an arbitrary conductive particle and conductive particles adjacent to the conductive particle, the shortest distance to the arbitrary conductive particle is defined as a first center distance, and the next shortest distance is defined as a second center distance, the first center distance and the second center distance are each 1.5 to 5 times the particle diameter of the conductive particles, and regarding an acute triangle formed by an arbitrary conductive particle $P_0$, a conductive particle $P_1$ spaced apart from the arbitrary conductive particle $P_0$ by the first center distance, and a conductive particle $P_2$ spaced apart from the arbitrary conductive particle $P_0$ by the first center distance or the second center distance, an acute angle α (hereinafter, also referred to as a tilt angle α in a second array direction) formed between a straight line orthogonal to a direction (hereinafter, referred to as a first array direction) of a straight line passing through the conductive particles $P_0$ and $P_1$ and a direction (hereinafter, referred to as the second array direction) of a straight line passing through the conductive particles $P_1$ and $P_2$ is 18 to 35°.

The present invention further provides a method of connecting a connection terminal of a first electronic component and a connection terminal of a second electronic component with the above-described anisotropic conductive film, wherein a longitudinal direction of the anisotropic conductive film is made coincident with a widthwise direction of the connection terminal of the first electronic component or the second electronic component, and in particular, a direction substantially orthogonal to the first array direction of the anisotropic conductive film is made coincident with a longitudinal direction of the connection terminal of the first electronic component or the second electronic component.

Here, "substantially orthogonal" includes not only a direction strictly orthogonal to the first array direction but also the range of a deviation caused when mounting an electronic component with the anisotropic conductive film. Usually, ±3° are included to the direction orthogonal to the first array direction.

In addition, the present invention provides a connected structure in which the first electronic component and the second electronic component are connected through anisotropic conductive connection by the above-described connecting method.

Advantageous Effects of Invention

According to the anisotropic conductive film of the present invention, the conductive particles are arranged at high density such that the first center distance as the shortest center distance and the second center distance as the next shortest center distance among the center distances between the adjacent conductive particles are each 1.5 to 5 times the particle diameter of the conductive particles. Furthermore, the conductive particles are arranged in the insulating adhesive layer in a lattice-like manner in specific directions. Consequently, a connection for high density wiring can be performed while suppressing a short circuit between adjacent terminals.

Furthermore, since the acute angle (tilt angle α in the second array direction) formed between the straight line orthogonal to the first array direction of the conductive particles and the second array direction is 18 to 35° in the anisotropic conductive film according to the present invention, the number of conductive particles trapped in a connection terminal can be increased by making anisotropic conductive connection while the direction substantially orthogonal to the first array direction of the anisotropic conductive film is made coincident with the longitudinal direction of the connection terminal. Thus, even when the anisotropic conductive film according to the present invention is used for COG connection, stable connection reliability can be obtained.

DESCRIPTION OF EMBODIMENTS

Hereinafter, the present invention will be described in detail with reference to the drawings.

Figure 1:
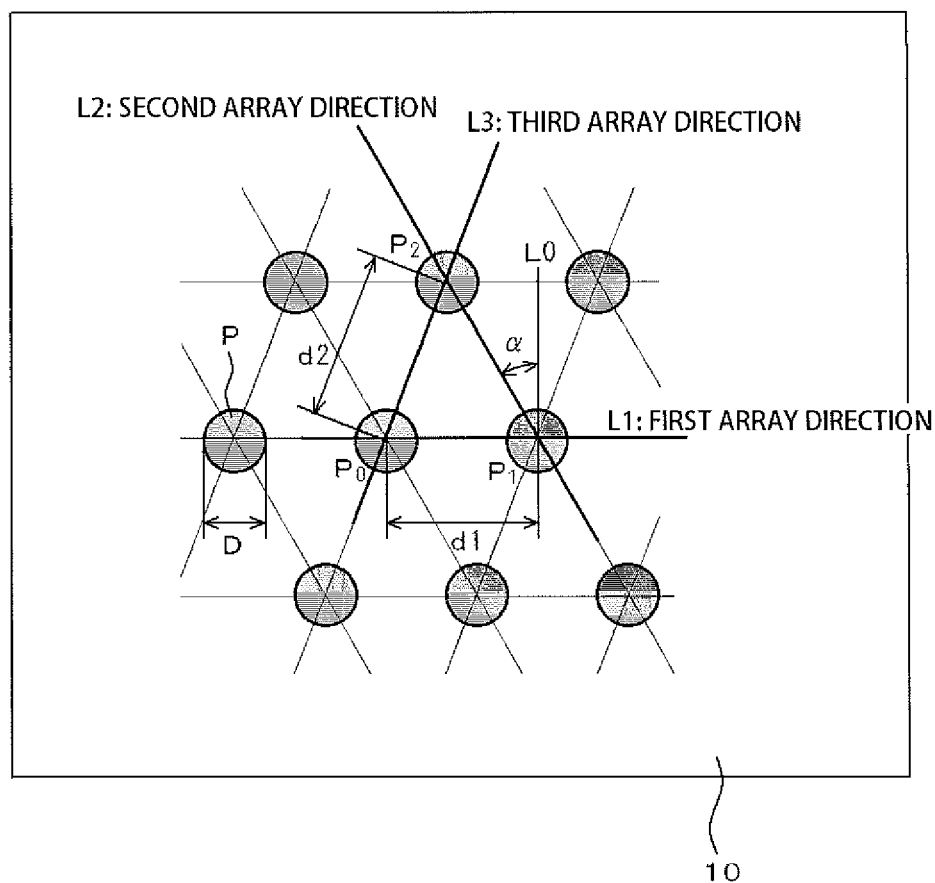
FIG. 1 is an arrangement diagram of conductive particles in an anisotropic conductive film of an example.

FIG. 1 is an arrangement diagram of conductive particles P in an anisotropic conductive film 1A according to an embodiment of the present invention. This anisotropic conductive film 1A includes an insulating adhesive layer 10 and conductive particles P fixed to the insulating adhesive layer 10 in a lattice-like arrangement.

In the anisotropic conductive film 1A, among center distances between an arbitrary conductive particle $P_0$ and conductive particles adjacent to the conductive particle $P_0$, suppose a case where the shortest distance is defined as a first center distance d1, and the next shortest distance is defined as the second center distance d2. In this case, the conductive particle $P_0$, a conductive particle $P_1$ spaced apart from the conductive particle $P_0$ by a first center distance d1, and a conductive particle $P_2$ spaced apart from the conductive particle $P_0$ by a second center distance form an acute triangle $P_0P_1P_2$. Regarding this acute triangle $P_0P_1P_2$, the conductive particles are arrayed in a first array direction L1 passing through the conductive particles $P_0$ and $P_1$ at a pitch d1; the conductive particles are also arrayed in a second array direction L2 passing through the conductive particles $P_1$ and $P_2$; and conductive particles are arrayed in a third array direction L3 passing through the conductive particles $P_0$ and $P_2$ at a pitch d2. Although the pitch d2 between the conductive particles in the third array direction is longer than the pitch d1 between the conductive particles in the first array direction L1 in this example, these pitches may be the same.

The particle diameter D of the conductive particles P is preferably 1 to 10 μm from the viewpoint of prevention of a short circuit and stability of bonding between electrodes.

The first center distance d1 and the second center distance d2 are each 1.5 to 5 times the particle diameter D of the conductive particles, preferably 1.8 to 4.5 times, and more preferably 2 to 4 times. When the first center distance d1 and the second center distance d2 are excessively short, a connection between terminals with the anisotropic conductive film is likely to cause a short circuit. When the first center distance d1 and the second center distance d2 are excessively long, the number of conductive particles trapped between terminals becomes insufficient.

The difference between the first center distance d1 and the second center distance d2 is preferably less than 2 times the particle diameter D of the conductive particles P, more preferably less than 1.5 times, and further preferably the same or less than the particle diameter D. This is because an excessively large difference deteriorates bump trapping properties during anisotropic conductive connection with the anisotropic conductive film 1A.

The density of the conductive particles P is preferably 2000 to 250000 particles/mm². This particle density is appropriately adjusted depending on the particle diameter and arrangement direction of the conductive particles P.

Even when attempting to manufacture the anisotropic conductive film in which conductive particles are arranged in a lattice-like manner at a predetermined density, the conductive particles may be sometimes lacked from the lattice position for reasons of practical manufacturing processes. Regarding the lacking of conductive particles from the lattice position, the number of continuously lacked conductive particles P in this anisotropic conductive film 1A is preferably 6 or less, more preferably 5 or less, and further preferably 4 or less, in each of the first array direction L1 and the second array direction L2, especially in each of the array directions L1, L2, and L3. Furthermore, when a region of 10 particles continuous from a position where an arbitrary conductive particle is arranged in the first array direction and 10 particles continuous from the position in the second array direction, that is, a region where 10 particles×10 particles (100 particles in total) are arranged, is extracted, the number of conductive particles present in the region where 100 particles are to be arranged is preferably 75 or more, more preferably 80 or more, further preferably 90 or more, and particularly preferably 94 or more.

Such suppression of lacked conductive particles facilitates trapping of the conductive particles in a number sufficient for conduction by a bump even when any part of the anisotropic conductive film is used in connecting a square bump with the anisotropic conductive film. Accordingly, the anisotropic conductive film can be adapted to anisotropic conductive connection at a fine pitch.

It is noted that as a method for suppressing lacking of the conductive particles in this manner, a wiping process is preferably repeatedly performed on a mold or a member having through holes when arranging the conductive particles P to the insulating adhesive layer 10 as described later.

In this anisotropic conductive film 1A, a tilt angle α in the second array direction is 18 to 35°. By defining the tilt angle α in the second array direction in this manner in the relationship between the particle diameter D and the pitches d1 and d2 as described above, the conductive particles for contributing to conduction can be ensured in a sufficient number in any part on the surface of the anisotropic conductive film 1A adopted as a rectangular region used for anisotropic conductive connection of a rectangular connection terminal (bump) with this anisotropic conductive film 1A.

Figure 2:
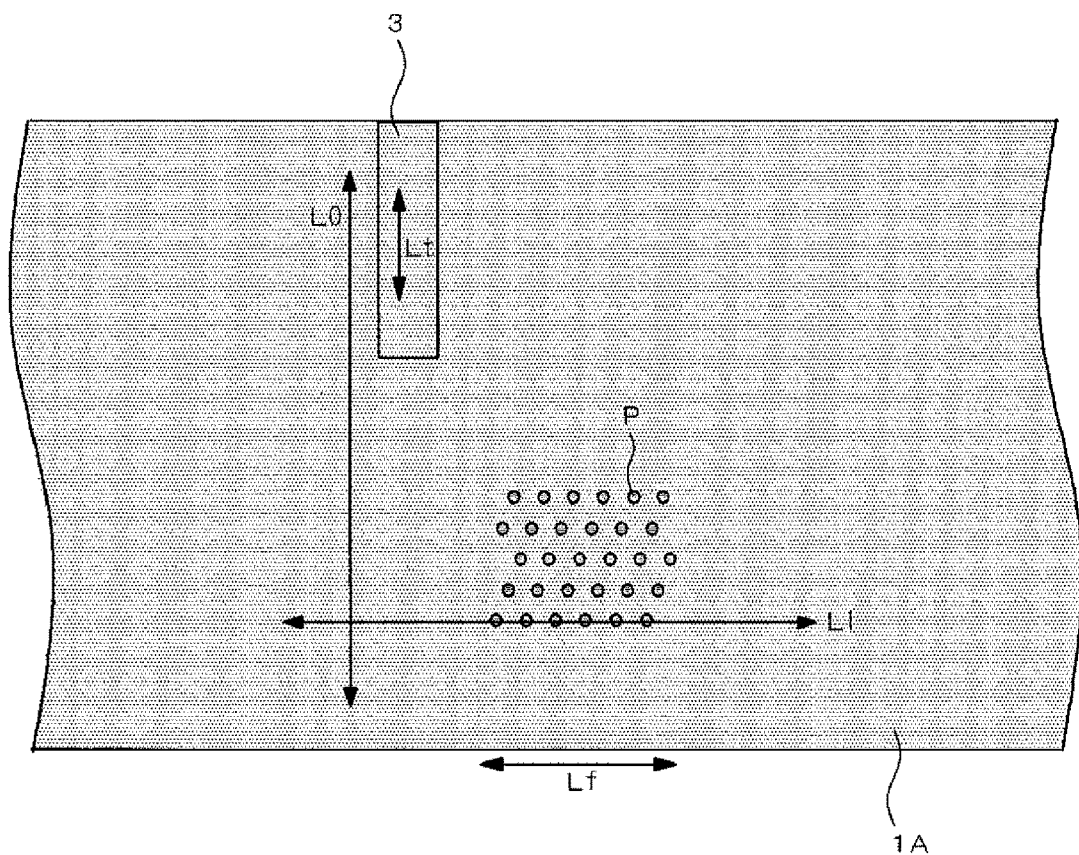
FIG. 2 is a diagram for explaining array directions of conductive particles in an anisotropic conductive film and a preferred orientation to a longitudinal direction of a connection terminal.

In general, in anisotropic conductive connection on the production line of electronic apparatuses, a connection terminal 3 and the anisotropic conductive film 1A are arranged such that the widthwise direction of the connection terminal 3 is along the longitudinal direction of the anisotropic conductive film 1A. Therefore, from the viewpoint of productivity of anisotropic conductive films, it is preferred that, as illustrated in FIG. 2, a longitudinal direction Lt of the rectangular connection terminal 3 is made coincident with a direction L0 orthogonal to the first array direction L1 (that is, the widthwise direction of the connection terminal 3 is made coincident with the first array direction L1). In other words, it is desirable that the first array direction L1 be substantially parallel to the longitudinal direction Lf of the anisotropic conductive film 1A, that is, it is desirable that the first array direction L1 of conductive particles be parallel to the longitudinal direction Lf of the anisotropic conductive film 1A within the range of a variation in the arrangement of the conductive particles, which is caused during manufacture of the anisotropic conductive film.

Figure 3:
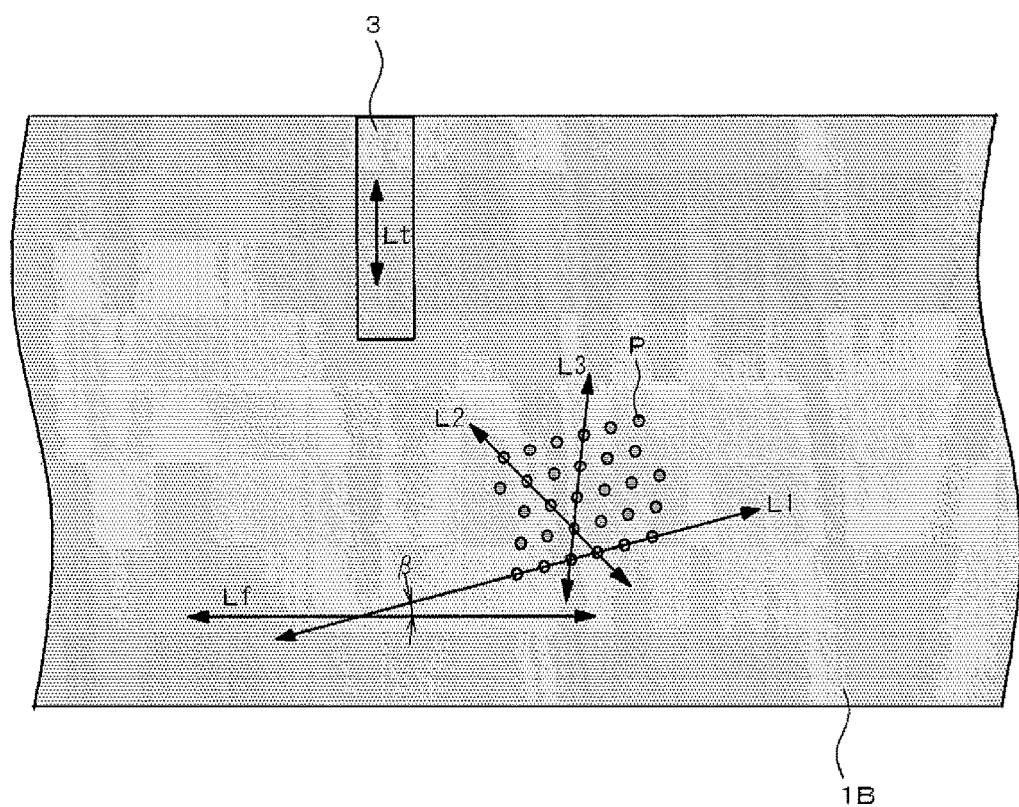
FIG. 3 is a diagram for explaining array directions of conductive particles in an anisotropic conductive film of another example and a preferred orientation to a longitudinal direction of a connection terminal.

On the other hand, from the viewpoint of improving properties of trapping conductive particles in a connection terminal during anisotropic conductive connection, it is preferred that all of the first array direction L1, the second array direction L2, and the third array direction L3 of conductive particles P be tilted with respect to the longitudinal direction of an anisotropic conductive film 1B, as indicated by the anisotropic conductive film 1B illustrated in FIG. 3. It is especially preferred that an acute angle β (hereinafter, also referred to as a tilt angle β) formed between the first array direction L1 and the longitudinal direction Lf of the anisotropic conductive film 1B be 5 to 25°.

It is noted that this anisotropic conductive film 1B is configured in a similar manner to the above-described anisotropic conductive film 1A, except that the first array direction L1 of the conductive particles P is tilted with respect to the longitudinal direction Lf of the anisotropic conductive film 1B.

Figure 4:
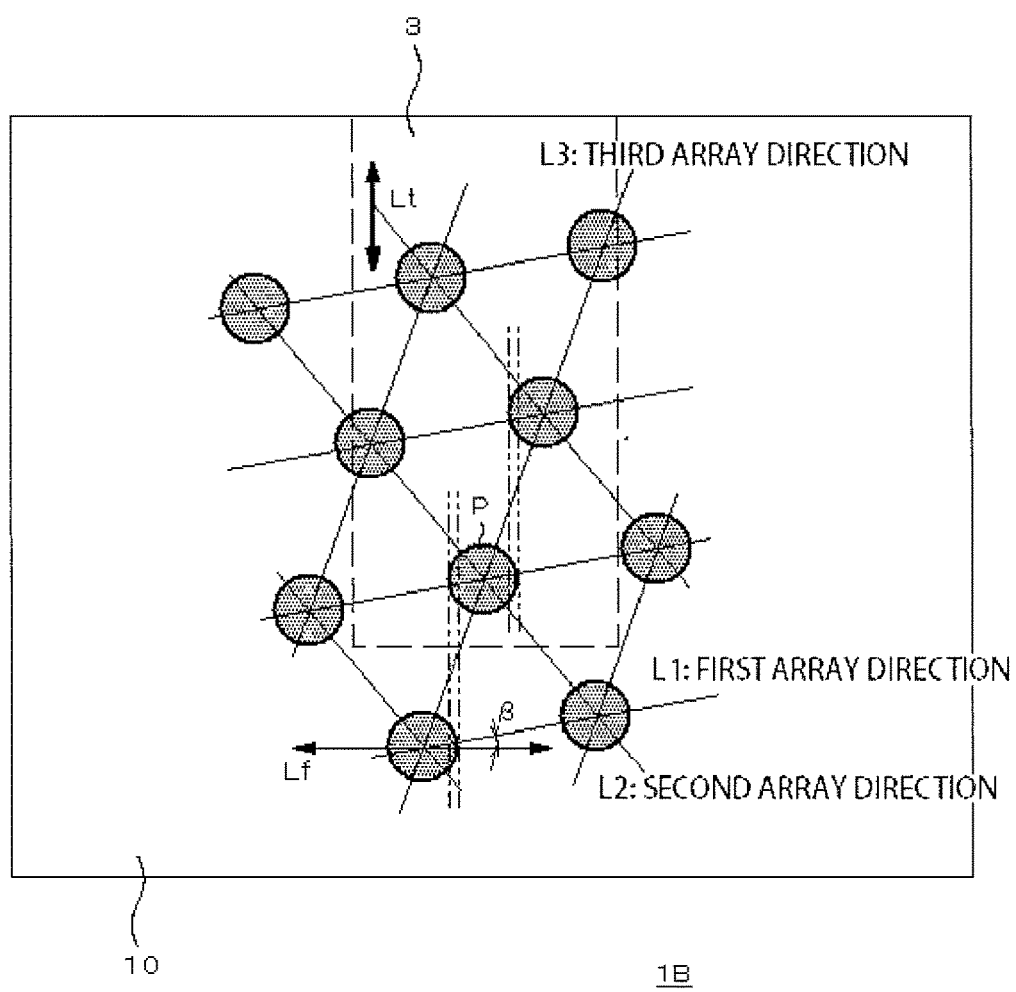
FIG. 4 is a diagram for explaining an arrangement of conductive particles in a connected product for evaluation including an anisotropic conductive film of an example.

Here, in order to arrange conductive particles in a dense state so that an anisotropic conductive film can be adapted to a connection of a terminal at a further finer pitch, as illustrated in FIG. 4 described later, the external tangent (double-dashed line) of a conductive particle P, which extends in the direction orthogonal to the longitudinal direction Lf of the anisotropic conductive film 1B, may pass through conductive particles Pc and Pe adjacent to the conductive particle P. This can further increase the area of conductive particles to the connection surface of the connection terminal 3, in a plan diagram in which the anisotropic conductive film 1B is superimposed on the terminal surface of the connection terminal 3. This can prevent the number of conductive particles P, which are placed between the connection terminals 3 facing each other during anisotropic conductive connection and pushed into the connection terminals 3 to allow conduction between the connection terminals 3, from becoming insufficient.

In the anisotropic conductive film according to the present invention, the structure of the conductive particles P themselves and the layer structure or constituent resin of the insulating adhesive layer 10 may be in various forms, as long as the conductive particles are arranged as described above.

That is, as the conductive particles P, any of conductive particles used in a known anisotropic conductive film can be appropriately selected and used. Examples of the conductive particles P may include metal particles such as nickel, cobalt, silver, copper, gold and palladium or metal coated resin particles. Two or more of these can be used in combination.

As the insulating adhesive layer 10, any insulating resin layer used in a known anisotropic conductive film can be appropriately adopted. Examples of the insulating adhesive layer 10 to be used may include a photo-radical polymerization-type resin layer containing an acrylate compound and a photo-radical polymerization initiator, a thermal radical polymerization-type resin layer containing an acrylate compound and a thermal radical polymerization initiator, a thermal cationic polymerization-type resin layer containing an epoxy compound and a thermal cationic polymerization initiator, and a thermal anionic polymerization-type resin layer containing an epoxy compound and a thermal anionic polymerization initiator. Each of these resin layers can be polymerized as necessary. The insulating adhesive layer 10 may include a plurality of resin layers.

The insulating adhesive layer 10 may further include, as necessary, an insulating filler such as silica fine particles, alumina, and aluminum hydroxide. The amount of the insulating filler to be added is preferably 3 to 40 parts by mass with respect to 100 parts by mass of the resin for forming the insulating adhesive layer. This can inhibit the conductive particles P from unnecessarily moving due to melted resin even when the insulating adhesive layer 10 is melted during anisotropic conductive connection.

A method of fixing the conductive particles P to the insulating adhesive layer 10 into the above-described arrangement may include: preparing a mold with concaves corresponding to the arrangement of the conductive particles P by a known method such as machining, laser beam machining, and photolithography; pouring conductive particles into the mold; filling an insulating adhesive layer-forming composition on the poured conductive particles; curing the composition in the mold; and releasing a product from the mold. Using this mold, a further mold may be prepared with a material having low rigidity.

Another example of the method may include: disposing, on an insulating adhesive layer-forming composition layer, a member with through holes arranged in a predetermined manner in order to place the conductive particles P in the above-described arrangement on the insulating adhesive layer 10; and supplying the conductive particles P on the member to allow the conductive particles P to pass through the through holes.

When performing anisotropic conductive connection between a connection terminal of a first electronic component such as a flexible substrate or a glass substrate and a connection terminal of a second electronic component such as an IC chip or an IC module with the anisotropic conductive film 1A or 1B according to the present invention, the longitudinal direction Lf of the anisotropic conductive film 1A or 1B is made coincident with the widthwise direction of the connection terminal 3 of the first electronic component or the second electronic component, as illustrated in FIG. 2 and FIG. 3. Accordingly, the number of trapped conductive particles P in the connection terminals can be sufficiently increased by taking advantage of the arrangement of the conductive particles P in the anisotropic conductive film 1A or 1B according to the present invention. Especially, the use of the anisotropic conductive film 1B in which all of the array directions of the conductive particles P are tilted with respect to the longitudinal direction Lf of the anisotropic conductive film can significantly enhance the properties of trapping the conductive particles P in the connection terminal 3.

For example, when performing COG connection for high density wiring by using a glass substrate or the like having a connection terminal formed from a transparent electrode as the first electronic component and an IC chip or the like as the second electronic component, more specifically, when the size of the connection surface of these connection terminals is 8 to 60 μm in width and 400 μm or less in length (the lower limit is the same as the width), or when the width in the widthwise direction of the connection surface of the connection terminals is less than 7 times the particle diameter of the conductive particles, the number of conductive particles that can be trapped in the connection terminals particularly increases in a stable manner when compared with the known anisotropic conductive connection, thereby enabling enhancement of connection reliability. It is noted that when the width in the widthwise direction of the connection terminal surface is smaller than this defined size, connection failures are often caused. When it is larger than this defined size, it becomes difficult to be adapted to high density mounting required in COG connection. Furthermore, when the length of the connection terminal surface is shorter than this defined size, stable conduction becomes difficult to obtain. When it is longer than this defined size, biased contact may be caused. On the other hand, the minimum distance between the connection terminals is determined according to the width in the widthwise direction of the connection surface of the connection terminals, and may be, for example, 8 to 30 μm.

In fine pitch terminals that can be connected to each other with the anisotropic conductive film according to the present invention, the minimum distance between the terminals spaced from and adjacent to each other in the parallel direction of terminals including the terminals connected to and facing each other may be less than 4 times the conductive particle diameter. Here, the minimum distance may be misaligned in the parallel direction within the range that enables anisotropic connection. In this case, the width in the widthwise direction of the connection surface of the terminals to be connected to each other may be less than 7 times the particle diameter of the conductive particles.

The present invention also encompasses a connected structure obtained by such anisotropic conductive connection between the first electronic component and the second electronic component.

EXAMPLES

Hereinafter, the present invention will be specifically described on the basis of examples.

Test Example 1

Conductive particles P (particle diameter D=4 μm) were arranged in an anisotropic conductive film under a condition of first center distance d1=second center distance d2=10 μm, and a tilt angle α was varied as shown in Table 1. In such a case, the maximum number of particles and the minimum number of particles of the conductive particles that could be trapped by a bump before heating and pressurization were calculated by superimposing a narrow bump having an electrode size of 15 μm×100 μm on a pattern of the anisotropic conductive film. In this case, the longitudinal direction of the anisotropic conductive film was made coincident with the widthwise direction of the bump. Furthermore, when 50% or more of the area of a particle was outside the edge portion of the bump, the particle was not counted as the conductive particle that could be trapped by the bump.

From this result, a tendency of the tilt angle α and particle trapping properties of the bump can be observed. The result is shown in Table 1.

TABLE 1

| | Tilt angle α (°) | | | | | | | | | |
|---|---|---|---|---|---|---|---|---|---|---|
| | 0° | 5° | 15° | 18° | 20° | 25° | 30° | 35° | 40° | 45° |
| Maximum number of particles | 20 | 13 | 13 | 14 | 14 | 14 | 18 | 18 | 13 | 14 |
| Minimum number of particles | 9 | 9 | 9 | 11 | 11 | 12 | 12 | 12 | 7 | 7 |

As understood from Table 1, when the tilt angle α is 18 to 35°, the difference between the minimum number of particles and the maximum number of particles trapped by the bump is small and stable. Thus, such an angle is effective for a narrow bump.

In contrast to this, an excessively small tilt angle α causes the difference in the number of trapped particles to increase. This is because an excessively small tilt angle causes the occupation degree of a particle array on the edge of a bump to directly influence the number of trapped particles. When the tilt angle α is excessively large, a similar phenomenon is also caused, and there is a tendency that the number of particles lying outside a bump increases.

As understood from the above, the tilt angle α needs to be appropriately maintained so that a narrow bump has constant trapping efficiency for maintaining stable conductivity.

Examples 1 to 8 and Comparative Examples 1 to 5

Next, in order to specifically examine a relationship between the distance between particles and the tilt angle α of conductive particles, anisotropic conductive films in which conductive particles (Sekisui Chemical Co., Ltd., AUL704, particle diameter: 4 μm) were arranged as shown in Table 2 were manufactured using resins shown in Table 2 in the following manner. That is, a mixed solution of insulating resins containing a thermoplastic resin, a thermosetting resin, and a latent curing agent in the composition shown in Table 2 was prepared. The mixed solution was applied onto a PET film with a film thickness of 50 μm, and dried in an oven at 80° C. for 5 minutes. Thus, an adhesive layer with a thickness of 20 μm was formed on the PET film.

On the other hand, a mold having the array pattern of convex portions corresponding to the arrangement shown in Table 2 was prepared. Then, a pellet of known transparent resin in a melted state was poured into the mold, and cooled to be solidified. Thus, a resin mold having convex portions corresponding to the arrangement pattern shown in Table 2 was formed. Conductive particles were filled in the concave portions of this resin mold, and covered with the above-described adhesive layer of insulating resin. The thermosetting resin contained in the insulating resin was cured by ultraviolet curing. Then, the insulating resin was peeled from the mold. In this manner, an anisotropic conductive film according to each of the examples and comparative examples was manufactured.

Examples 9 to 13 and Comparative Examples 6 and 7

Anisotropic conductive films according to Examples 9 to 13 and Comparative Examples 6 and 7 were manufactured in the similar manner to the above-described examples and comparative examples, except that the conductive particles were arranged as shown in Table 3.

Here, Comparative Example 7 has a shape of a tetragonal lattice, and Examples 3 and 9 to 13 each have a shape of hexagonal lattice.

In Comparative Example 1 and Comparative Example 6, the conductive particles were dispersed in a low boiling point solvent, and the obtained liquid was sprayed so that the conductive particles were randomly arranged on the same plane.

The center distance d (the first center distance d1 and the second center distance d2) between adjacent conductive particles of the conductive particles was measured using an optical microscope. In this case, 100 particles or 50 pairs of particles present in the first array direction or the second array direction were arbitrarily measured, and an average value thereof was calculated. Thus, it was confirmed that the calculated value was a desired center distance d between adjacent particles. The results are shown in Table 2.

On the other hand, in Comparative Examples 1 and 6, 100 conductive particles were arbitrarily selected, and the center distance between particles closest to each other of the conductive particles was measured.

Evaluation

The anisotropic conductive film according to each of the examples and comparative examples was evaluated for (a) the number of trapped particles, (b) initial conduction resistance, (c) conduction reliability, and (d) short circuit incidence, in the following methods. The results are shown in Table 2 and Table 3.

(a) The Number of Trapped Particles (a-1) Average Number

With the anisotropic conductive film according to each of the examples and comparative examples, 100 bumps of 15×100 μm and a glass substrate were heated and pressurized (180° C., 80 MPa, 5 seconds) to obtain a connected product. In this case, the longitudinal direction of the anisotropic conductive film was made coincident with the widthwise direction of the bumps. Then, the number of trapped particles in each bump was measured, and the average number of trapped particles per bump was calculated.

(a-2) Minimum Number

Of the numbers of trapped particles in the bumps measured in (a-1), the minimum number of trapped particles was obtained.

(b) Initial Conduction Resistance

The anisotropic conductive film according to each of the examples and comparative examples was placed between a glass substrate and an IC for evaluation of initial conduction and conduction reliability, and heated and pressurized (180° C., 80 MPa, 5 seconds) to obtain a connected product for evaluation. In this case, the longitudinal direction of the anisotropic conductive film was made coincident with the widthwise direction of the bump. Then, the conduction resistance of the connected product for evaluation was measured.

Here, the terminal patterns of the IC for evaluation and the glass substrate corresponded to each other, and the sizes thereof are as follows.

IC for Evaluation of Initial Conduction and Conduction Reliability
  Outer diameter: 0.7×20 mm
  Thickness: 0.2 mm
  Bump specifications: gold plating, height 12 μm, size 15×100 μm, distance between bumps 15 μm
Glass Substrate
  Glass material: manufactured by Corning Incorporated
  Outer diameter: 30×50 mm
  Thickness: 0.5 mm
  Electrode: ITO wiring (c) Conduction Reliability The connected product for evaluation between the IC for evaluation and the anisotropic conductive film according to each of the examples and comparative examples prepared in (b) was placed in a constant temperature bath at a temperature of 85° C. and a humidity of 85% RH for 500 hours, and thereafter the conduction resistance was measured in the similar manner to that in (b). It is noted that the conduction resistance of 5 Ω or more is not preferred from the viewpoint of practical conduction stability of the connected electronic component.

(d) Short Circuit Incidence

As an IC for evaluation of short circuit incidence, the following IC (7.5 μm spaced comb teeth TEG (test element group)) was prepared.
  Outer diameter: 1.5×13 mm
  Thickness: 0.5 mm
  Bump specifications: gold plating, height 15 μm, size 25×140 μm, distance between bumps 7.5 μm The anisotropic conductive film according to each of the examples and comparative examples was placed between an IC for evaluation of short circuit incidence and a glass substrate having a pattern corresponding to the IC for evaluation, and heated and pressurized under a connection condition similar to those in (b) to thereby obtain a connected product. The short circuit incidence of the connected product was calculated. The short circuit incidence is calculated according to "the number of short circuits/the total number of 7.5 μm spaces". The short circuit incidence of 1 ppm or more is not preferred from the viewpoint of practical manufacture of the connected structure.

TABLE 2

|  | Comparative Example 1 | Comparative Example 2 | Comparative Example 3 | Comparative Example 4 | Example 1 | Example 2 |
|---|---|---|---|---|---|---|
| Insulating resin | | | | | | |
| Phenoxy resin *1 | 60 | 60 | 60 | 60 | 60 | 60 |
| Epoxy resin *2 | 40 | 40 | 40 | 40 | 40 | 40 |
| Cationic curing agent *3 | 2 | 2 | 2 | 2 | 2 | 2 |

TABLE 2-continued

| Arrangement of conductive particles | | | | | | |
|---|---|---|---|---|---|---|
| Particle diameter D (μm) | 4 | 4 | 4 | 4 | 4 | 4 |
| Tilt angle α (°) | Random | 0 | 5 | 15 | 18 | 20 |
| Center distance between adjacent particles (d = d1 = d2) (μm) | Ave 10 Min 4 | 12 | 12 | 12 | 12 | 12 |
| Ratio between inter-particle distance and particle diameter: (d-D)/D | | 2 | 2 | 2 | 2 | 2 |
| Evaluation | | | | | | |
| Number of trapped particles (Average) | 9.6 | 3.6 | 5.5 | 5.5 | 7 | 7.9 |
| Number of trapped particles (minimum) | 5 | 0 | 2.3 | 2.7 | 4.7 | 6.2 |
| Initial conduction resistance (Ω) | 0.2 | 0.2 | 0.2 | 0.2 | 0.2 | 0.2 |
| Conduction reliability (Ω) | Less than 5 | 5 or more | 5 or more | 5 or more | Less than 5 | Less than 5 |
| Short circuit incidence (ppm) | 3000 | Less than 1 | Less than 1 | Less than 1 | Less than 1 | Less than 1 |

| | Example 3 | Example 4 | Comparative Example 5 | Example 5 | Example 6 | Example 7 | Example 8 |
|---|---|---|---|---|---|---|---|
| Insulating resin | | | | | | | |
| Phenoxy resin *1 | 60 | 60 | 60 | 60 | 60 | 60 | 60 |
| Epoxy resin *2 | 40 | 40 | 40 | 40 | 40 | 40 | 40 |
| Cationic curing agent *3 | 2 | 2 | 2 | 2 | 2 | 2 | 2 |
| Arrangement of conductive particles | | | | | | | |
| Particle diameter D (μm) | 4 | 4 | 4 | 4 | 4 | 4 | 4 |
| Tilt angle α (°) | 30 | 35 | 45 | 35 | 35 | 18 | 18 |
| Center distance between adjacent particles (d = d1 = d2) (μm) | 12 | 12 | 12 | 6 | 20 | 6 | 20 |
| Ratio between inter-particle distance and particle diameter: (d-D)/D | 2 | 2 | 2 | 0.5 | 4 | 0.5 | 4 |
| Evaluation | | | | | | | |
| Number of trapped particles (Average) | 8.2 | 8.2 | 4.8 | 34.7 | 5.5 | 33.6 | 5.4 |
| Number of trapped particles (minimum) | 7 | 6.5 | 2.7 | 31.4 | 4 | 31 | 3.6 |
| Initial conduction resistance (Ω) | 0.2 | 0.2 | 0.2 | 0.2 | 0.2 | 1.2 | 0.2 |
| Conduction reliability (Ω) | Less than 5 | Less than 5 | 5 or more | Less than 5 | Less than 5 | Less than 5 | Less than 5 |
| Short circuit incidence (ppm) | Less than 1 | Less than 1 | Less than 1 | Less than 1 | Less than 1 | Less than 1 | Less than 1 |

(Note)
*1 Nippon Steel & Sumitomo Metal Corporation, YP-50 (thermoplastic resin)
*2 Mitsubishi Chemical Corporation, jER 828 (thermosetting resin)
*3 Sanshin Chemical Industry Co., Ltd., SI-60L (latent curing agent)

TABLE 3

| | Comparative Example 6 | Comparative Example 7 | Example 9 | Example 10 | Example 11 | Example 12 | Example 13 |
|---|---|---|---|---|---|---|---|
| Insulating resin | | | | | | | |
| Phenoxy resin *1 | 60 | 60 | 60 | 60 | 60 | 60 | 60 |
| Epoxy resin *2 | 40 | 40 | 40 | 40 | 40 | 40 | 40 |
| Cationic curing agent *3 | 2 | 2 | 2 | 2 | 2 | 2 | 2 |
| Arrangement of conductive particles | | | | | | | |
| Particle diameter D (μm) | 4 | 4 | 4 | 4 | 4 | 4 | 4 |
| Arrangement density (particles/mm$^2$) | 10000 | 10000 | 10000 | 10000 | 10000 | 10000 | 10000 |
| Tilt angle α (°) | Random | 90 | 30 | 30 | 30 | 30 | 30 |
| Tilt angle β (°) | — | 15 | 5 | 10 | 15 | 20 | 25 |

TABLE 3-continued

|  | Comparative Example 6 | Comparative Example 7 | Example 9 | Example 10 | Example 11 | Example 12 | Example 13 |
|---|---|---|---|---|---|---|---|
| Center distance between adjacent particles (d = d1 = d2) (μm) | Ave 10 Min 4 | 10 | 10 | 10 | 10 | 10 | 10 |
| Ratio between inter-particle distance and particle diameter: (d-D)/D | — | 1.5 | 1.5 | 1.5 | 1.5 | 1.5 | 1.5 |
| Evaluation |  |  |  |  |  |  |  |
| Number of trapped particles (Average) | 8 | 12 | 14 | 14 | 14 | 14 | 14 |
| Number of trapped particles (minimum) | 0 | 4 | 10 | 11 | 12 | 11 | 10 |
| Initial conduction resistance (Ω) | 0.2 | 0.2 | 0.2 | 0.2 | 0.2 | 0.2 | 0.2 |
| Conduction reliability (Ω) | Less than 5 | Less than 5 | Less than 5 | Less than 5 | Less than 5 | Less than 5 | Less than 5 |
| Short circuit incidence (ppm) | 3000 | 100 | Less than 1 | Less than 1 | Less than 1 | Less than 1 | Less than 1 |

(Note)
*1 Nippon Steel & Sumitomo Metal Corporation, YP-50 (thermoplastic resin)
*2 Mitsubishi Chemical Corporation, jER 828 (thermosetting resin)
*3 Sanshin Chemical Industry Co., Ltd., SI-60L (latent curing agent)

As understood from Table 2, when the tilt angle α of conductive particles is 18 to 35°, reduced initial conduction resistance, high conduction reliability, and suppressed short circuit incidence are achieved, and anisotropic conductive connection adapted to high density wiring having a terminal width of about 4 times the particle diameter can be performed.

In contrast to this, it is understood that in Comparative Example 1, an excessively high particle density leads to worsened insulation. Furthermore, in Comparative Example 2 to Comparative Example 5, the tilt angle α is outside the range of 18 to 35°, the number of trapped particles is low, and conduction reliability is lacked.

Furthermore, as understood from Table 3, in Examples 9 to 13 in which each array direction of conductive particles is tilted to the longitudinal direction of the anisotropic conductive film, excellent conduction reliability and reduced short circuit incidence are similarly achieved. A connected product for evaluation obtained by connecting a glass substrate and an IC for evaluation of initial conduction and conduction reliability with the anisotropic conductive film according to each of Examples 9 to 13 was observed. As a result, as apparent in the arrangement of conductive particles illustrated in FIG. 4, an external tangent (double-dashed line) of a conductive particle P in a longitudinal direction Lt of a bump 3 overlapped conductive particles Pc and Pe adjacent to the conductive particle P, and the external tangent passed through the conductive particles Pc and Pe. This demonstrates that even when the width of the bump 3 becomes further narrower, conductive particles in a number sufficient for conduction can be trapped.

In comparison between the appearances of the connected products for evaluation including the anisotropic conductive films according to Comparative Example 7 and Examples 9 to 13, a difference in a dent state between the conductive particle Pc located in a center portion in the width direction of the bump 3 and the conductive particle Pe located on the edge of the bump 3 was smaller in the connected products for evaluation including the anisotropic conductive films according to Examples 9 to 13 than in the connected product for evaluation including the anisotropic conductive film according to Comparative Example 7. This demonstrates that the use of the anisotropic conductive films according to the examples enables achievement of more uniform pressure bonding. It is noted that when the bump area is narrow, conductive particles are not necessarily trapped both on the edge and in the center portion in the width direction of one bump 3. Therefore, the above-described results were obtained by observing the conductive particle trapped on the edge and the conductive particle trapped in the center portion in the width direction in any one of many bumps arranged in parallel.

Examples 14 to 19

In Examples 3 and 9 to 13, the particle diameter D of conductive particles was changed from 4 μm to 3 μm, the center distance between adjacent particles was defined as 6 μm (that is, (d–D)/D=1), and the arrangement density was defined as 28000 particles/mm². With the conditions, anisotropic conductive films of Examples 14 to 19 were manufactured, and evaluated in a similar manner. As a result, these also achieved low initial conduction resistance, high conduction reliability, and short circuit incidence suppressing effects, which were substantially similar to those in Examples 3 and 9 to 13. Furthermore, in connected products for evaluation of these, the dent states of the conductive particle located on the edge of the bump and the conductive particle located in the center portion in the width direction were also similar to those in Examples 9 to 13.

Furthermore, anisotropic conductive films having a particle density of 60000 particles/mm² prepared in Example 14 and Comparative Example 1 were each connected with an IC including a bump having a bump area of 700 μm² (bump size: 14 μm×50 μm, distance between bumps: 14 μm), in a similar manner to when the number of trapped particles was measured in Example 1. Then, the frequency of trapping of conductive particles in one bump was studied. The results are shown in FIG. 5.

Figure 5:
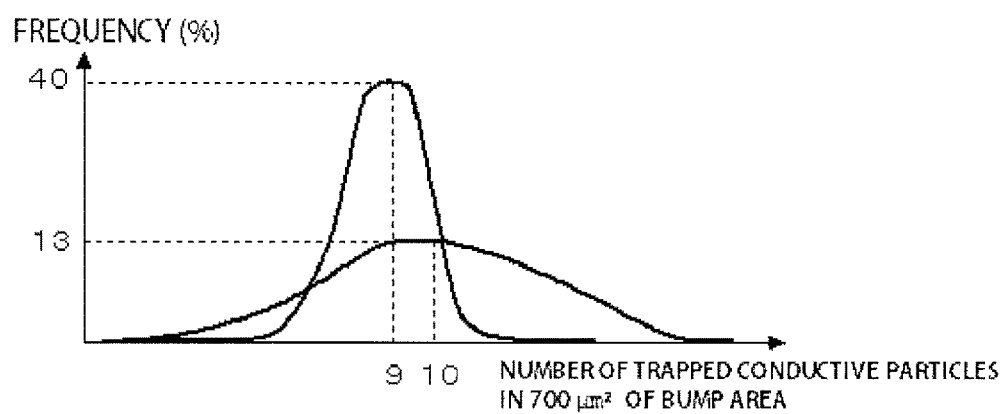
FIG. 5 is a diagram illustrating a relationship between the number of trapped particles per bump and frequency in connected products including anisotropic conductive films according to an example and a comparative example.

As understood from FIG. 5, in Example 14, the incidence abruptly increases when the number of trapped particles per bump is around 9, compared to Comparative Example 1, and the number of trapped conductive particles per bump is stabilized.

Examples 20 to 25

In Examples 3 and 9 to 13, the particle diameter D of conductive particles was not changed but still 4 μm, the center distance between adjacent particles was defined as 7 μm (that is, (d–D)/D=0.75, and the arrangement density: 20000 particles/mm²). With the conditions, anisotropic conductive films according to Examples 20 to 25 were manufactured, and evaluated in a similar manner. As a result, these also achieved low initial conduction resistance, high conduction reliability, and short circuit incidence suppressing effects, which were substantially similar to those in Examples 3 and 9 to 13. Furthermore, in connected products for evaluation of these, the dent states of the conductive particle located on the edge of the bump and the conductive particle located in the center portion in the width direction were also similar to those in Examples 9 to 13.

Examples 26 to 31

In Examples 3 and 9 to 13, the particle diameter D of conductive particles was not changed but still 4 μm, the center distance between adjacent particles was defined as 16 μm (that is, (d−D)/D=3, and the arrangement density: 4000 particles/mm$^2$). With the conditions, anisotropic conductive films according to Examples 26 to 31 were manufactured, and evaluated in a similar manner. As a result, these showed initial conduction resistance higher than those in Examples 3 and 9 to 13, but there was no practical problem. The high conduction reliability and short circuit incidence suppressing effects were substantially similar to those in Examples 3 and 9 to 13. It is considered that this may be because the anisotropic conductive films according to Examples 26 to 31 had low arrangement density of the conductive particles. Furthermore, in connected products for evaluation of these, the dent states of the conductive particle located on the edge of the bump and the conductive particle located in the center portion in the width direction were also similar to those in Examples 9 to 13.

Examples 32 to 33

To 100 parts by mass of insulating resins, 20 parts by mass of a silica fine particle filler (silica fine particle, AEROSIL RY200, Nippon Aerosil Co., Ltd.) were added in Examples 5 and 7. With the conditions, anisotropic conductive films were manufactured in a similar manner to Examples 5 and 7, and evaluated. As a result, there were obtained low initial conduction resistance, high conduction reliability, and short circuit incidence suppressing effects, which were similar to those in Examples 5 and 7.

REFERENCE SIGNS LIST 1A, 1B anisotropic conductive film
connection terminal or bump
10 insulating adhesive layer
L0 direction orthogonal to first array direction
L1 first array direction
L2 second array direction
L3 third array direction
Lf longitudinal direction of anisotropic conductive film
Lt longitudinal direction of connection terminal
d1 first center distance, pitch
d2 second center distance, pitch
D particle diameter of conductive particle
P, $P_0$, $P_1$, $P_2$, Pc, Pe conductive particle
α tilt angle
β tilt angle

The invention claimed is:
1. An anisotropic conductive film comprising an insulating adhesive layer and conductive particles arranged in the insulating adhesive layer in a lattice-like manner, wherein when among center distances between an arbitrary conductive particle and conductive particles adjacent to the conductive particle, a shortest distance to the arbitrary conductive particle is defined as a first center distance, and a next shortest distance is defined as a second center distance, the first center distance and the second center distance are each 1.5 to 5 times a particle diameter of the conductive particles, and the difference between the first center distance and the second center distance is less than 1.5 times the particle diameter of the conductive particles.

2. The anisotropic conductive film according to claim 1, wherein, regarding an acute triangle formed by an arbitrary conductive particle $P_0$, a conductive particle $P_1$ spaced apart from the arbitrary conductive particle $P_0$ by the first center distance, and a conductive particle $P_2$ spaced apart from the arbitrary conductive particle $P_0$ by the first center distance or the second center distance, an acute angle is formed between a straight line orthogonal to a direction (hereinafter, referred to as a first array direction) of a straight line passing through the conductive particles $P_0$ and $P_1$ and a direction (hereinafter, referred to as a second array direction) of a straight line passing through the conductive particles $P_1$ and $P_2$.

3. The anisotropic conductive film according to claim 2, wherein, the acute angle a formed between the straight line orthogonal to the first array direction and the second array direction is 18 to 35°.

4. The anisotropic conductive film according to claim 2, wherein the first array direction is substantially parallel to a longitudinal direction of the anisotropic conductive film.

5. The anisotropic conductive film according to claim 2, wherein, when a direction passing through the conductive particles $P_0$ and $P_2$ is defined as a third array direction, the first array direction, the second array direction, and the third array direction are tilted with respect to the longitudinal direction of the anisotropic conductive film.

6. The anisotropic conductive film according to claim 5, wherein an angle β formed between the first array direction and the longitudinal direction of the anisotropic conductive film is 5 to 25°.

7. The anisotropic conductive film according to claim 1, wherein a density of the conductive particles is 2000 to 250000 particles/mm$^2$.

8. A connecting method of connecting a connection terminal of a first electronic component and a connection terminal of a second electronic component with the anisotropic conductive film according to claim 2, wherein a longitudinal direction of a connection terminal of the anisotropic conductive film is made coincident with a widthwise direction of the connection terminal of the first electronic component or the second electronic component.

9. The connecting method according to claim 8, wherein a direction substantially orthogonal to the first array direction of the anisotropic conductive film is made coincident with a longitudinal direction of the connection terminal of the first electronic component or the second electronic component.

10. The connecting method according to claim 8, wherein the first electronic component is a glass substrate having a connection terminal formed from a transparent electrode, and the second electronic component is an IC chip.

11. The connecting method according to claim 8, wherein a size of a connection surface of the connection terminal is 8 to 60 m in width and 400 μm or less in length.

12. A connected structure in which a first electronic component and a second electronic component are connected through anisotropic conductive connection by the anisotropic conductive film according to claim 1.

13. A method for manufacturing a connected structure, comprising connecting a first electronic component to a second electronic component through anisotropic conductive connection by the anisotropic conductive film according to claim 1.

14. The anisotropic conductive film according to claim 1, wherein the first center distance and the second center distance are each 1.8 to 4.5 times the particle diameter of the conductive particles.

15. The anisotropic conductive film according to claim 1, wherein the first center distance and the second center distance are each 2 to 4 times the particle diameter of the conductive particles.

16. The anisotropic conductive film according to claim 1, wherein the difference between the first center distance and the second center distance is the same as or less than the particle diameter of the conductive particles.

17. The anisotropic conductive film according to claim 1, wherein the difference between the first center distance and the second center distance is the same as or less than the particle diameter of the conductive particles.

18. The anisotropic conductive film according to claim 1, wherein the insulating adhesive layer includes a plurality of resin layers.

19. An anisotropic conductive film comprising an insulating adhesive layer and conductive particles arranged in the insulating adhesive layer in a lattice-like manner,
wherein when among center distances between an arbitrary conductive particle and conductive particles adjacent to the conductive particle, a shortest distance to the arbitrary conductive particle is defined as a first center distance, and a next shortest distance is defined as a second center distance, and
the first center distance and the second center distance are each 1.5 to 5 times a particle diameter of the conductive particles,
wherein, regarding an acute triangle formed by an arbitrary conductive particle $P_0$, a conductive particle $P_1$ spaced apart from the arbitrary conductive particle $P_0$ by the first center distance, and a conductive particle $P_2$ spaced apart from the arbitrary conductive particle $P_0$ by the first center distance or the second center distance, an acute angle is formed between a straight line orthogonal to a direction (hereinafter, referred to as a first array direction) of a straight line passing through the conductive particles $P_0$ and $P_1$ and a direction (hereinafter, referred to as a second array direction) of a straight line passing through the conductive particles $P_1$ and $P_2$,
wherein a number of continuously lacked conductive particles is 6 or less in each of the first array direction and the second array direction.

20. The anisotropic conductive film according to claim 1, wherein a number of continuously lacked conductive particles is 6 or less in each of the first array direction and the second array direction.

21. The anisotropic conductive film according to claim 19, wherein the insulating adhesive layer includes a plurality of resin layers.

22. The anisotropic conductive film according to claim 19, wherein a difference between the first center distance and the second center distance is less than 2 times the particle diameter of the conductive particles.

23. The anisotropic conductive film according to claim 19, wherein, regarding an acute triangle formed by an arbitrary conductive particle $P_0$, a conductive particle $P_1$ spaced apart from the arbitrary conductive particle $P_0$ by the first center distance, and a conductive particle $P_2$ spaced apart from the arbitrary conductive particle $P_0$ by the first center distance or the second center distance, an acute angle is formed between a straight line orthogonal to a direction (hereinafter, referred to as a first array direction) of a straight line passing through the conductive particles $P_0$ and $P_i$ and a direction (hereinafter, referred to as a second array direction) of a straight line passing through the conductive particles $P_1$ and $P_2$.

24. The anisotropic conductive film according to claim 19, wherein, the acute angle a formed between the straight line orthogonal to the first array direction and the second array direction is 18 to 35°.

25. The anisotropic conductive film according to claim 19, wherein the first array direction is substantially parallel to a longitudinal direction of the anisotropic conductive film.

26. The anisotropic conductive film according to claim 19, wherein, when a direction passing through the conductive particles $P_0$ and $P_2$ is defined as a third array direction, the first array direction, the second array direction, and the third array direction are tilted with respect to the longitudinal direction of the anisotropic conductive film.

27. The anisotropic conductive film according to claim 26, wherein an angle β formed between the first array direction and the longitudinal direction of the anisotropic conductive film is 5 to 25°.

28. The anisotropic conductive film according to claim 19, wherein a density of the conductive particles is 2000 to 250000 particles/mm$^2$.

29. A connecting method of connecting a connection terminal of a first electronic component and a connection terminal of a second electronic component with the anisotropic conductive film according to claim 19, wherein a longitudinal direction of a connection terminal of the anisotropic conductive film is made coincident with a widthwise direction of the connection terminal of the first electronic component or the second electronic component.

30. The connecting method according to claim 29, wherein a direction substantially orthogonal to the first array direction of the anisotropic conductive film is made coincident with a longitudinal direction of the connection terminal of the first electronic component or the second electronic component.

31. The connecting method according to claim 29, wherein the first electronic component is a glass substrate having a connection terminal formed from a transparent electrode, and the second electronic component is an IC chip.

32. The connecting method according to claim 29, wherein a size of a connection surface of the connection terminal is 8 to 60 μm in width and 400 μm or less in length.

33. A connected structure in which a first electronic component and a second electronic component are connected through anisotropic conductive connection by the anisotropic conductive film according to claim 19.

34. A method for manufacturing a connected structure, comprising connecting a first electronic component to a second electronic component through anisotropic conductive connection by the anisotropic conductive film according to claim 19.

35. The anisotropic conductive film according to claim 19, wherein the first center distance and the second center distance are each 1.8 to 4.5 times the particle diameter of the conductive particles.

36. The anisotropic conductive film according to claim 19, wherein the first center distance and the second center distance are each 2 to 4 times the particle diameter of the conductive particles.

37. The anisotropic conductive film according to claim 19, wherein the difference between the first center distance and the second center distance is the same as or less than the particle diameter of the conductive particles.

\* \* \* \* \*